United States Patent
Wang et al.

(10) Patent No.: US 7,964,512 B2
(45) Date of Patent: Jun. 21, 2011

(54) METHOD FOR ETCHING HIGH DIELECTRIC CONSTANT MATERIALS

(75) Inventors: Xikun Wang, Sunnyvale, CA (US); Wei Liu, San Jose, CA (US); Yan Du, Santa Clara, CA (US); Mei Hua Shen, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 11/208,573

(22) Filed: Aug. 22, 2005

(65) Prior Publication Data

US 2007/0042601 A1    Feb. 22, 2007

(51) Int. Cl.
*H01L 21/302* (2006.01)

(52) U.S. Cl. ......... 438/722; 257/E21.218; 257/E21.219; 257/E21.253

(58) Field of Classification Search .................. 438/689, 438/706, 707, 710, 712, 722; 257/E21.218, 257/E21.219, E21.253
See application file for complete search history.

(56) References Cited

U.S. PATENT DOCUMENTS

| | | | |
|---|---|---|---|
| 4,372,807 A | 2/1983 | Vossen, Jr. et al. | |
| 4,375,385 A | 3/1983 | Halon | |
| 4,618,398 A | 10/1986 | Nawata et al. | |
| 4,842,676 A | 6/1989 | Jucha et al. | |
| 4,855,016 A | 8/1989 | Jucha et al. | |
| 4,986,896 A | 1/1991 | Avidan et al. | |
| 6,010,966 A | 1/2000 | Ionov | |
| 6,451,647 B1 | 9/2002 | Yang et al. | |
| 6,511,872 B1 * | 1/2003 | Donnelly et al. | 438/197 |
| 6,511,918 B2 | 1/2003 | Wege et al. | |
| 6,566,148 B2 | 5/2003 | Hsu et al. | |
| 6,660,647 B1 | 12/2003 | Ono et al. | |
| 6,666,986 B1 | 12/2003 | Vaartstra | |
| 6,902,681 B2 | 6/2005 | Nallan et al. | |
| 2003/0045098 A1 | 3/2003 | Verhaverbeke et al. | |
| 2003/0129847 A1 | 7/2003 | Celii et al. | |
| 2003/0170985 A1 | 9/2003 | Hwang et al. | |
| 2004/0007561 A1 | 1/2004 | Nallan et al. | |
| 2004/0011380 A1 | 1/2004 | Ji et al. | |
| 2004/0074869 A1 | 4/2004 | Wang et al. | |

(Continued)

FOREIGN PATENT DOCUMENTS

JP    2291131    11/1990

(Continued)

OTHER PUBLICATIONS

Tomoyoshi, English translation of Japanese Patent Abstract for Dry Etching of Barrier Metal/Aluminum Laminated Film; Patent No. JP2291131; Pub. Date Nov. 30, 1990.

(Continued)

*Primary Examiner* — Brook Kebede
(74) *Attorney, Agent, or Firm* — Blakely, Sokoloff Taylor & Zafman LLP

(57) ABSTRACT

In one implementation, a method is provided for etching a high k dielectric material in a plasma etch reactor, the method comprising plasma etching the high k dielectric material with a first plasma gas reactant mixture having $BCl_3$. The high k dielectric material may include $Al_2O_3$ in a stack having a silicon layer. The etching may include supplying a passivation gas, for example $C_2H_4$, and may further include supplying a diluent gas such as a noble gas, for example He. In some implementations, the etching may be performed with a reactive ion etch process.

30 Claims, 2 Drawing Sheets

U.S. PATENT DOCUMENTS

| | | | |
|---|---|---|---|
| 2004/0262262 A1* | 12/2004 | Chiu et al. | 216/67 |
| 2005/0081781 A1* | 4/2005 | Lin et al. | 117/104 |
| 2005/0164511 A1* | 7/2005 | Chen et al. | 438/706 |
| 2005/0176191 A1* | 8/2005 | Kumar et al. | 438/197 |
| 2005/0215062 A1* | 9/2005 | Miyagawa et al. | 438/706 |
| 2006/0252265 A1* | 11/2006 | Jin et al. | 438/689 |
| 2007/0004260 A1 | 1/2007 | Drexler et al. | |

FOREIGN PATENT DOCUMENTS

| | | |
|---|---|---|
| JP | 6151383 | 5/1994 |
| JP | 2004-296477 | 10/2004 |
| JP | 2005-039015 | 2/2005 |
| JP | 2005-086080 | 3/2005 |
| JP | 2006-310676 | 11/2006 |
| JP | 2007-510533 | 1/2007 |
| JP | 2007-035860 | 2/2007 |
| KR | 20040103453 | 12/2004 |
| WO | PCT/US2004/014610 | 12/2004 |
| WO | WO 2004/109772 A2 | 12/2004 |

OTHER PUBLICATIONS

KIPO Office Action mailed Aug. 20, 2008, Notice to File a Response for Korean Patent Application 2006-0078958 which claims benefit of present U.S. Appl. No. 11/208,573, by Wang et al.

SIPO Office Action mailed Jul. 24, 2009, Notice to file a response for Chinese Patent Application No. 200610111269.2 which claims benefit of present U.S. Appl. No. 11/208,573, by Wang et al., 6 pages.

* cited by examiner

METHOD FOR ETCHING HIGH DIELECTRIC CONSTANT MATERIALS

BACKGROUND

Integrated circuits (IC) play a significant role in the field of modern semiconductor technology. The development of integrated circuits has made possible a modern world with advanced electrical technology. Applications of integrated circuits are so widespread and their significance affects our every day lives from cellular phones, digital televisions, to flash memory chips in cameras. These integrated circuits typically are formed on silicon substrates or wafers, which can include active semiconductor devices with structured processes for a wide range of stacked layers made from different materials, allowing for memory capabilities.

Recently, in modern semiconductor technology, integrated circuits have advanced towards smaller devices with more memory. In the manufacture of semiconductor integrated circuits (IC), typically, dielectric materials such as silicon dioxide ($SiO_2$), silicon nitride ($Si_3N_4$) and silicon oxynitride (SiON) have been widely used. However, as technology has progressed, IC device geometry has become smaller, resulting in progressively thinner integrated circuit devices. When typical IC devices approach thicknesses of a few nanometers or less, conventional aforementioned dielectric materials can typically undergo electronic breakdown and can no longer provide the memory storage needed.

To address the aforementioned problems, high dielectric constant materials (high k dielectric materials) have been used in semiconductor chip manufacturing with their potential application in memory devices. Examples of high k materials include aluminum oxide, ($Al_2O_3$), hafnium oxide ($HfO_2$), zirconium oxide ($ZrO_2$) and mixtures thereof, and metal silicates such as $HfSi_xO_y$, $ZrSiO_4$ and mixtures thereof.

Although the aforementioned high-k materials are sought after for their use in IC applications, it is known to those skilled in the art that it can be very difficult to dry etch. High k materials typically are very stable and resistive against most etching reactions (due to their chemical inertness), which has led to their use as etch stop layers and hard mask layers in plasma etching and other materials.

While a typical deposition process desirably generates high k dielectric films on a substrate (for example, a silicon wafer), unwanted reactions can form on these films and other parts of a reaction chamber. Accumulation of these unwanted residues can result in particle shedding, degradations of deposition uniformity and these effects can lead to wafer defects, and the worse, subsequent device failure.

With respect to high dielectric constant materials, aluminum oxide ($Al_2O_3$) typically is known to those skilled in the art to have one of the slowest etch rates. Typically, even under powerful plasma conditions, conditions can result in high chuck bias voltage resulting in enhanced ion sputtering and sputter induced etching.

Conventional methods of etching high k dielectric materials, typically involves chlorine ($Cl_2$) gas at a high wafer temperature, and fluorine gas. There have been many disadvantages with these methods. It is well known to those skilled in the art that $Cl_2$ based chemistry aggressively etches polysilicon (poly), resulting in low selectivity to poly. The etched high k dielectric layers can form a residue on the wafer after etching yielding in low capacitive structures or defective wafers. Specifically with respect to aluminum oxide, this represents a great difficulty to etch $Al_2O_3$ on top of a thin poly1 layer for flash memory and other related applications. Fluorine has been shown to be typically ineffective in etching high k dielectric materials. Fluorine can typically produce a metal fluoride product that is nonvolatile and thus difficult to remove from the reactor.

A flash memory stack for 55 nm node and beyond consists of poly2/$Al_2O_3$(or other high k dielectric material)/poly 1. It is well known to those skilled in the art, that $Al_2O_3$ is different from poly in the film stack and difficult to etch. The key for successfully etching high k dielectric materials, such as $Al_2O_3$ on top of a thin layer of poly 1 layer of the new flash memory film stack is to find a process which has a reasonable $Al_2O_3$ etch rate and a high selectivity to poly silicon.

As those skilled in the art would appreciate, there is a need for methods that can etch high dielectric constant materials. Such methods of etching should preferably not have the undesirable properties of promoting unwanted residues that could make the wafer defective. Still further, there is a need for methods to etch high dielectric constant materials, such as aluminum oxide, that are cost effective, have high selectivity and a reasonably high etch rate.

SUMMARY

In one implementation, a method is provided for etching a high k dielectric material in a plasma etch reactor, the method includes plasma etching the high k dielectric material with a plasma gas reactant mixture having $BCl_3$. The high k dielectric material may be $Al_2O_3$ in a stack that also has at least one silicon layer. A passivation gas, such as a hydrocarbon, i.e. $CH_4$, $C_2H_4$, etc. may be supplied for etching, along with a diluent gas, such as a noble gas, for example He. In some implementations, the etching may be performed with a reactive ion etch process.

DESCRIPTION

Figure 1:
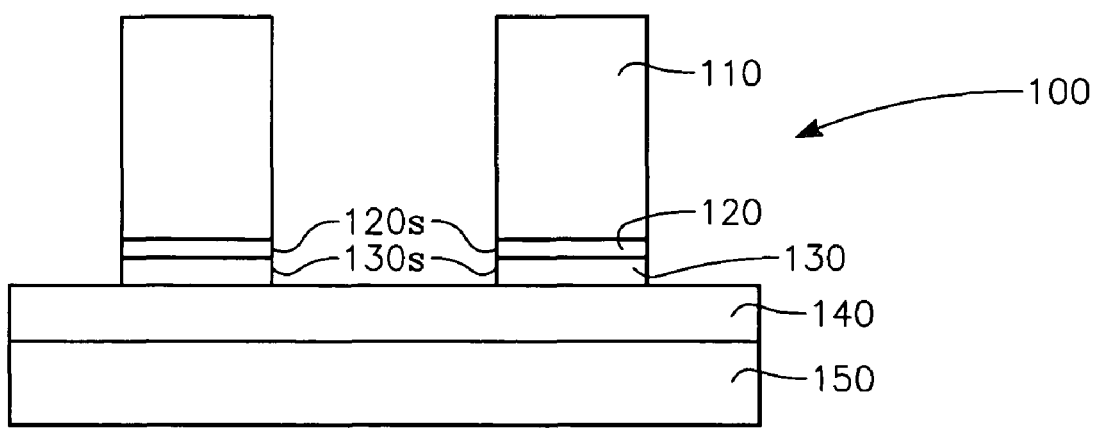
FIG. 1 shows a cut away side view of a partially etched stack have a high dielectric constant layer or high k layer to be etched.
Figure 2:
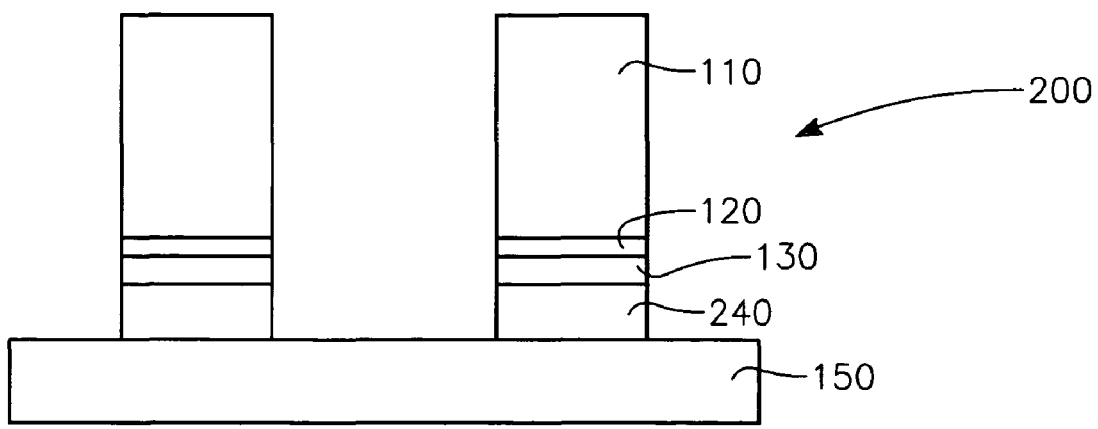
FIG. 2 shows a cut away side view of a stack after etching the high k layer of FIG. 1.

FIG. 1 shows a cut away side view of a partially etched stack 100 having a high dielectric constant layer or high k layer 140 to be etched. In this implementation, a mask layer 110 is patterned over the high k layer 140. Additional optional layers 120 and 130 may be located between the mask layer 110 and the high k layer 140. In one embodiment, the mask layer 110 is typically a hard mask such as a plasma enhanced chemical vapor deposition oxide or PECVD oxide, BSG or Boron doped spin on glass, other oxide hard mask, silicon nitride, or other hard mask. In one embodiment, the optional layer 120 is tungsten (W), and the optional layer 130 is a titanium nitride (TiN). Under the high k layer is a polysilicon layer 150. FIG. 2 shows a stack 200 after etching the high k layer 140 of FIG. 1. The etched high k layer 240 is etched to the underlying polysilicon layer 150, which may be part of the substrate in some embodiments. A barrier layer (not shown) such as silicon nitride (SiN) or other barrier layer material may be located between the high k layer 140 and the polysilicon layer 150. In such an embodiment, the high k layer 140 is etched to the barrier layer.

Materials having a high dielectric constant are referred to as high k dielectric materials. The high k dielectric materials typically have a dielectric constant greater than 4, in some embodiments more preferably greater than 5, and in some embodiments even more preferably at least 7. In some embodiments, the high-k material preferably is at least one member selected from the group consisting of $Al_2O_3$, $HfO_2$, $AlHf_xO_y$, $ZrO2$, $HfSi_xO_y$, $ZrSi_xO_y$, and mixtures thereof.

Referring to FIG. 1, in one implementation, the etching of the high k material layer 140 is performed with $BCl_3$. In the case of the high k material $Al_2O_3$, the $BCl_3$ chemically etches the $Al_2O_3$ by formation of volatile $AlCl_3$. A passivation gas such as $C_2H_4$, $CH_4$ or or other hydrocarbon may be introduced to provide passivation of the sidewall structures 120s and 130s of layers 120 and 130, respectively, and to improve selectivity to the underlying polysilicon layer 150. The ratio of $BCl_3$ to $C_2H_4$, or to $CH_4$, is selected to provide a desired etch rate and high selectivity to the polysilicon layer 150. Hydrocarbon additives reduce the etch rate of the polysilicon layer 150 to improve selectivity. One advantage of $C_2H_4$ is that it is the polymer precursor of polypropylene and has a similar content to photoresist.

A diluent gas such a He can be introduced with the passivation, for example with $C_2H_4$. The atomic ratio of $C_2H_4$ to He may be about 2.7% to 1 in some implementations. Other ratios are possible. In one particular implementation, commercially available $C_2H_4$:He which contains 2.7% $C_2H_4$ and 97.3% He for a dilution factor of 37.

In other implementations, the high k material layer 140 may be etched using a gas mixture comprising other halogen containing gas, along with a passivation gas containing other hydrocarbons. Thus, in some implementations, the passivation gas can comprise an inert gas selected from the group consisting of helium, argon, neon, xenon and krypton.

Referring to FIG. 1, in some implementations the high k layer 140 etch process may be performed using a reactive ion etch. All the etching steps, can be performed in a single plasma etching chamber such as a DPS Etch Reactor, or also a Reaction Ion Etch (RIE) both available from Applied Materials, Inc. of Santa Clara, Calif. In one RIE process, the process parameters included about 0 Watts of source power, about 200 W bias power, about 25 mT chamber pressure, about 30sscm of BCl3, at about 80 degrees C. This provides less than 100 Angstroms of loss of polysilicon layer 150 with low sidewall taper and good sidewall profile at an etch rate of about 150 Angstroms/minute. The bias power may range from about 150 W to about 300 W. In general, sidewall passivation of the W layer 120 and TiN layer 130 is harder to control at higher cathode temperature than at lower temperatures at or below about 100 degrees C. For example 80 degree C. provides good passivation of the W layer 120 and TiN layer 130 to provide a good etch profile in the RIE process above.

In another implementation, an inductively coupled mode, with a source power of about 800 W, bias power of 200 W, at 10 mT, and about 60 scm of $BCl_3$ at about 250 degrees C. provided good sidewall profiles. Although the inductively coupled mode provided higher etch rate of an $Al_2O_3$ high k layer 140, the RIE mode discussed above provides about 3 times higher selectivity to the polysilicon layer 150. In some implementations, the bias power range is between about 150-300 W.

In some implementations, the etch may be performed in a two step etch process, with a main etch and an over etch step, as is known in the art. A main etch is designed to etch the high k layer 140. The over etch step assures uniform penetration of the high dielectric constant layer 140 to the polysilicon layer 150, or to a barrier layer (not shown in FIG. 1). The high k dielectric material such as $Al_2O_3$ may be etched at temperatures as high as about 250 degrees C. or as low as about 80 degrees C. After the main and over etching steps have been completed, dechucking and cleaning of the chamber can be performed, as desired. The lower temperature operation possible in some implementations, for example below about 100 degrees C., or as low as 80 degrees C., can facilitate more rapid cool-off and dechucking to improve wafer throughput.

In some implementations, a hydrocarbon passivation gas comprising hydrogen and carbon may be added to the gas mixture, at chamber pressures below 40 milliTorr. The passivation gas is a hydrocarbon, such as $-(CH_2)_n-$ gas, in some implementations ethylene, but other hydrocarbons such as methane for example may be used.

In order to etch $Al_2O_3$ at a reasonable etch rate and a high selectivity to polysilicon, $BCl_3$ or boron trichloride is used. Although $Cl_2$ gas has been typically used to etch high k dielectric materials, it can etch the polysilicon and other materials aggressively. Boron helps to reduce polysilicon etch rate by forming a silican-boron combination, thus increasing selectivity and providing in successful results when etching materials with high dielectric constants. Boron trichloride can chemically etch the $Al_2O_3$ by formation of volatile AlCl3. The ratio of $BCl_3$ to $C_2H_4$/He or $CH_4$ is selected to provide a reasonable $Al_2O_3$ etch rate and a high selectivity to poly silicon. The formation of $B_2O_3$ and B—Si complexes will promote the high selectivity to polysilicon. Hydrocarbon passivation gas, such as $C_2H_4$/He, $CH_4$ and others reduces polysilicon etch rate to improve selectivity, reduce the etch rate when the polysilicon layer is exposed, and inhibits lateral attack of the sidewalls 120s and 130s of the other layers 120 and 130, which may include one or more polysilicon layers in other embodiments (not shown in FIG. 1).

As discussed above, in addition to the reactive agents described herein, inert diluent gases such as helium, argon, neon, krypton and xenon can also be added. Inert diluent gases are needed for safety reason and also can modify the plasma characteristics. The concentration of the inert gas may range from 1.0% to about 3.0%, in the case helium. Other inert diluent gases are possible.

In some implementations, a conventional chamber cleaning may be performed after the etching process.

In another implementation, HBr may be used to etch the high k dielectric material. As above, a passivation gas, and a diluent gas may be used. In the case of the $Al_2O_3$ high k material, HBr etches the $Al_2O_3$ by formation of volatile $AlBr_3$. A ratio of HBr to $C_2H_4$ is selected to provide a reasonable etch rate. The diluent may be an inert gas such as He with a ratio of about 2.7% to 1 of $C_2H_4$ to He as discussed above.

Figure 3:
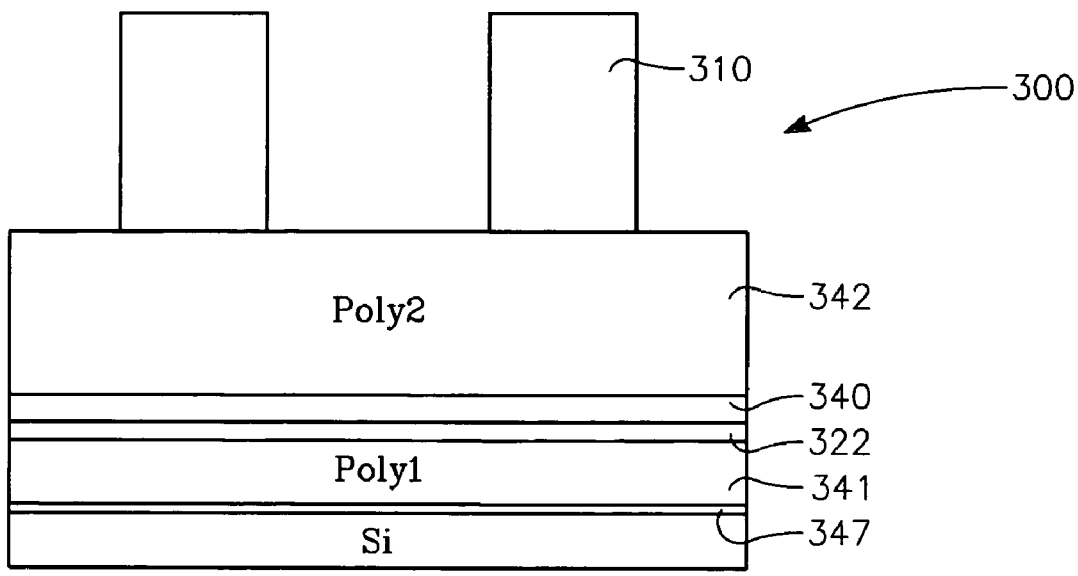
FIG. 3 shows a cut away side view of a stack including a high dielectric constant layer prior to etching.

Turning to FIG. 3, in one implementation, the high k material is located between two layers of polysilicon, poly1 is indicated by reference number 341, and poly2 is indicated by reference number 342. Poly2 342 is located above the high k layer 340 and poly1 341 is located below the high k layer 340. In accordance with one implementation, the stack 300 is etched using a mask 310, which may be a hard mask in some implementations. The etching of poly2 342 stops at the high k layer 340, for example, at an $Al_2O_3$ layer, such that the etch has high selectivity to the $Al_2O_3$. An $Al_2O_3$ etch follows and has high selectivity to the poly2 342 and the poly1 341, and stops at poly1 341. An optional barrier layer 322 of SiN may be used. The poly1 341 then may be etched to the underlying gate oxide layer 347.

To achieve high etch selectivity in the $Al_2O_3$ etch, the reactant mixture may have $BCl_3$, and possibly a hydrocarbon passivation gas such as $C_2H_4$. The $Al_2O_3$ layer 340 may be etched with $BCl_3$ etchant and $C_2H_4$ diluted with He. The dilution is particularly effective for small flow rates of $C_2H_4$. The process may comprise two steps, a main etch followed by an over etch, which can have the same reactant mixture as the main etch. In some implementations, a temperature greater than 100 degrees C. provides good results, with a temperature of 150 degrees providing still better results.

Figure 4:
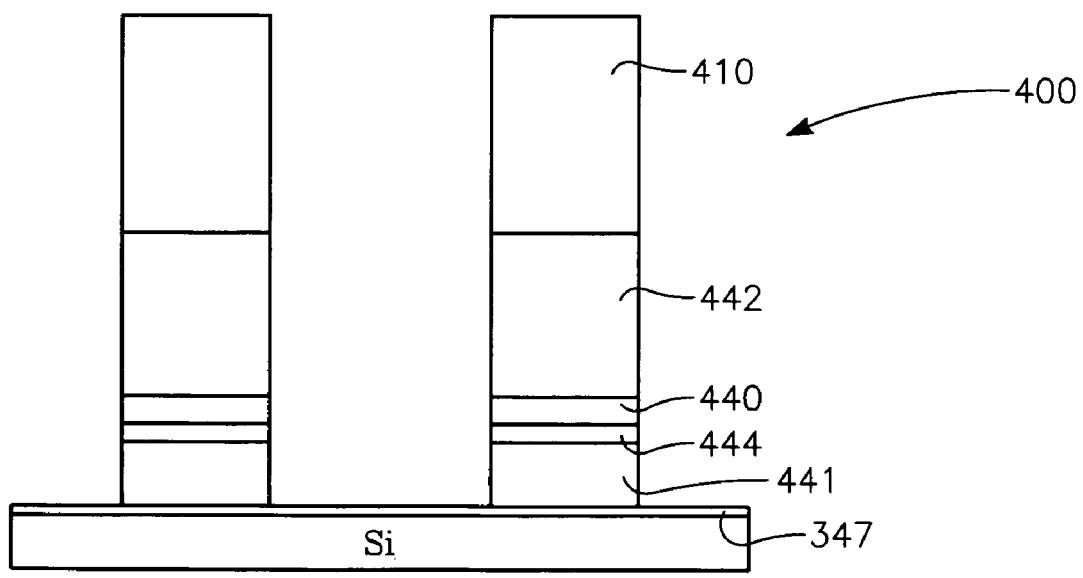
FIG. 4 shows a cut away side view of the stack after etching the high k layer of FIG. 3.

FIG. 4 shows a cut away side view of the etched stack 400 after etching the high k layer of FIG. 3. To form the etched stack 400, the etched high k layer 440 is formed after the etched poly2 layer 442. The etched barrier layer 444 is formed after etching the high k layer 440, and the etched poly1 layer 441 is formed after etching of the etched poly2, the etched high k layer 440, and the etched barrier layer 444. The mask 410 is used to define the etched poly2, the etched high k layer 440, the etched barrier layer 444, and the etched poly1 layer 441.

Typically, polysilicon related processes utilize chemical plasma etch with decoupled plasma source power and bias power. Some of the above implementations, however, may be performed with reactive ion etch, using bias power only. In certain implementations, reactive ion etch of the high k material provides greater selectivity with the polysilicon. In one example implementation, the process window has a bias power between about 100 W to about 400 W, with about 0 W source power, with between about 5 millitorr and about 50 millitorr chamber pressure, with between about 20 sccm and about 200 sccm flow rate of $BCl_3$, at about 30 degrees C. to about 350 degrees C.

It is possible in some implementations to use a chemical plasma etch for the main etch process, and then switch to a reactive ion etch near the endpoint, or for the over etch step discussed above.

One of the several advantages of certain implementations discussed above is that the main etchant gas mixture may be formed without fluorine, which is likely to react with the $Al_2O_3$ to form aluminum fluoride contaminants.

The foregoing is merely illustrative of the invention and is not intended to limit the invention to the disclosed compounds. The implementations discussed herein are not limited to the specific stack configurations illustrated. Other stack configurations and implementations are possible. Variations and changes which are obvious to one skilled in the art are intended to be within the scope and nature of the invention which are defined in the appended claims.

What is claimed is:

1. A method for etching a high k dielectric material comprising:
    placing a substrate comprising said high k material in a reactor having a decoupled plasma source; and
    etching the high k dielectric material using a plasma gas reactant mixture comprising $BCl_3$, and supplying a passivation gas comprising $C_2H_4$ wherein the etching comprises about 0 watts of source power and a bias power in a range of from about 100 watts to about 400 watts.

2. The method of claim 1, wherein the high k dielectric material is selected from the group consisting of aluminum oxide, hafnium oxide, zirconium oxide, and mixtures thereof.

3. The method of claim 2, wherein the dielectric material is aluminum oxide.

4. The method of claim 1, wherein etching further comprising supplying a diluent gas comprising a noble gas.

5. The method of claim 4, wherein supplying the diluent gas comprises supplying He.

6. The method of claim 5 further comprising etching using an oxide hard mask.

7. The method of claim 5, wherein the high k dielectric material comprises $Al_2O_3$.

8. The method of claim 7, wherein etching comprises etching within a range at about 250 degrees Celsius.

9. The method of claim 7, wherein etching comprises etching below about 100 degrees Celsius.

10. The method of claim 9, wherein etching comprises etching at about 80 degrees Celsius.

11. The method of claim 1, wherein etching comprises etching within a range at about 250 degrees Celsius.

12. The method of claim 1, wherein etching comprises etching below about 100 degrees Celsius.

13. The method of claim 12, wherein etching comprises etching at about 80 degrees Celsius.

14. The method of claim 1, wherein etching the high k dielectric material comprises etching a stack comprising silicon.

15. The method of claim 14, wherein etching the high k dielectric material comprises etching the high k dielectric material under silicon comprising silicon.

16. The method of claim 15, wherein etching the high k dielectric material comprises etching the high k dielectric material to a silicon comprising material under the high k dielectric material.

17. The method of claim 15, wherein etching the high k dielectric material comprises etching the high k dielectric material to a barrier layer under the high k dielectric material.

18. The method of claim 5, wherein supplying He comprises supplying He with a concentration in a range from about 1% to about 3%.

19. The method of claim 5, wherein supplying He comprises supplying He and $C_2H_4$ comprises providing an atomic ratio of $C_2H_4$ to He of about 2.7% to 1.

20. The method of claim 1 said bias power in a range of from about 150 watts to about 300 watts.

21. A method for etching a high k dielectric material comprising:
    placing a substrate comprising said high k material in a reactor having a decoupled plasma source; and
    etching an $AlO_3$ layer in a silicon comprising stack using a plasma formed with $BCl_3$, a hydrocarbon passivation gas comprising $C_2H_4$, and a noble gas wherein the etching comprises about 0 watts of said decoupled plasma source power and a bias power in a range of from about 100 watts to about 400 watts.

22. The method of claim 21, wherein the noble gas comprises He.

23. The method of claim 22, wherein the noble gas comprises He having a concentration in a range from about 1% to about 3%.

24. The method of claim 21, wherein etching comprises etching within a range at about 250 degrees Celsius.

25. The method of claim 21, wherein etching comprises etching below about 100 degrees Celsius.

26. The method of claim 21, wherein etching comprises etching at about 80 degrees Celsius.

27. The method of claim 21, wherein etching the high k dielectric material comprises etching the high k dielectric material under a silicon comprising layer.

28. The method of claim 27, wherein etching the high k dielectric material comprises etching the high k dielectric material to a silicon comprising material under the high k dielectric material.

29. The method of claim 27, wherein etching the high k dielectric material comprises etching the high k dielectric material to a barrier layer under the high k dielectric material.

30. The method of claim 21 said bias power in a range of from about 150 watts to about 300 watts.

* * * * *

UNITED STATES PATENT AND TRADEMARK OFFICE
CERTIFICATE OF CORRECTION

PATENT NO. : 7,964,512 B2
APPLICATION NO. : 11/208573
DATED : June 21, 2011
INVENTOR(S) : Xikun Wang et al.

Page 1 of 1

It is certified that error appears in the above-identified patent and that said Letters Patent is hereby corrected as shown below:

In claim 1, col. 5 at line 3 delete "high k material" and insert --high k dielectric material--

In claim 21, col. 6 at line 5 delete "$AlO_3$" and insert --$Al_2O_3$--

Signed and Sealed this
Seventeenth Day of April, 2012

David J. Kappos
*Director of the United States Patent and Trademark Office*

UNITED STATES PATENT AND TRADEMARK OFFICE
CERTIFICATE OF CORRECTION

PATENT NO. : 7,964,512 B2
APPLICATION NO. : 11/208573
DATED : June 21, 2011
INVENTOR(S) : Xikun Wang et al.

It is certified that error appears in the above-identified patent and that said Letters Patent is hereby corrected as shown below:

Column 5, line 44 delete "high k material" and insert --high k dielectric material--

Column 6, line 36 delete "$AlO_3$," and insert --$Al_2O_3$--

This certificate supersedes the Certificate of Correction issued April 17, 2012.

Signed and Sealed this
Eighth Day of May, 2012

David J. Kappos
*Director of the United States Patent and Trademark Office*